United States Patent [19]
Horn et al.

[11] Patent Number: 4,588,967
[45] Date of Patent: May 13, 1986

[54] INTEGRATED VARACTOR TUNED COAXIAL GUN OSCILLATOR FOR 60 GHZ OPERATION

[75] Inventors: Robert E. Horn, Middletown, N.J.; Harold Jacobs, deceased, late of West Long Branch, N.J., by Lydia S. Jacobs, executrix

[73] Assignee: The United States of America as represented by the Secretary of the Army, Washington, D.C.

[21] Appl. No.: 679,974

[22] Filed: Dec. 10, 1984

[51] Int. Cl.[4] .............................................. H03B 7/12
[52] U.S. Cl. ................................... 331/107 G; 331/96
[58] Field of Search ................. 331/86, 90, 96, 107 R, 331/107 DP, 107 G; 333/232, 235

[56] References Cited

PUBLICATIONS

C. F. Klein "Combine Varactor Control with Dielectric Tuning" Microwaves vol. 15, No. 8, pp. 50–52, Aug. 1976.

Primary Examiner—James B. Mullins
Assistant Examiner—G. Wan
Attorney, Agent, or Firm—Anthony T. Lane; Jeremiah G. Murray; Maurice W. Ryan

[57] ABSTRACT

An electronic varactor tuner is integrally combined with a mechanically tuned Gunn oscillator to provide an increased tuning range in a light weight, compact, rugged combination with easily and quickly replaceable components.

7 Claims, 3 Drawing Figures

INTEGRATED VARACTOR TUNED COAXIAL GUN OSCILLATOR FOR 60 GHZ OPERATION

TECHNICAL FIELD

This invention relates to microwave diode radio frequency oscillators and, more particularly, to millimeter wavelength oscillators using solid state components. The general field of practical usage is in radar and communications.

BACKGROUND OF THE INVENTION

Known millimeter wave oscillators generally use high frequency devices such as Gunn or IMPATT diodes which oscillate in metal cavities. In the frequency range from about 35 GHz to about 300 GHz, there are applications for oscillators used in receiver and transmitter communication devices and in radar units. These applications of such oscillator devices, it may be generally stated, involve the use of low power. The high operating frequencies and related short wavelengths of the outputs require extremely precise construction of the oscillator physical entities. Machining for the parts of such devices and apparatus is extremely costly, which limits the practical applications wherein the use of the devices is economically feasible.

In order to benefit from the relatively high stability of the mechanically tuned units such Gunn diode oscillators and IMPATT diode oscillators because of their mechanical adjustment and setting features, a desideratum would be to provide some ancillary type of adjustment which could fine-tune the oscillator component without disturbing its basic mechanical setting or mechanically set frequency in a resonating cavity.

With this, then, being the state of the art, we conceived and developed our invention with the primary objective providing a fine-tuning ancillary component to the basic mechanically tuned and set oscillator devices.

A further and important object of the invention is to provide an adjustably tuneable millimeter wave source which has substantially rugged, inexpensive, and readily replaceable components.

A still further object of the invention is to provide the combination according to our concept and development with discrete and replaceable elements being readily and commercially available without the need for specialized manufacture, fabrication or assembly.

The invention, then, provides a compact, low cost, mechanically tuneable Gunn oscillator with additional electronic tuning through the use of a coupled and operably assembled varactor diode. By changing the bias on the varactor diode through electronic circuitry, the basic or set range of the Gunn oscillator can be fine tuned with hitherto unattainable precision and accuracy to frequencies within useful ranges on either side of the Gunn diode set point frequency.

SUMMARY OF THE INVENTION

In general, the invention according to our concept comprehends a millimeter wave oscillator which comprises, in combination, a housing or base portion which is provided with a resonating cavity, a solid state mechanically tuneable element which is adjustably moveable disposed in the housing, conveniently by means of a threaded engagement in a brass collar or the like fitting secured to the housing, which tuneable element is capable of producing millimeter-wave energy output at a frequency corresponding to its position in the resonate cavity, and a solid state electronically tuneable element arranged and disposed in circuit with the mechanically tuneable element and physically disposed concentrically with same. Position adjustment means are provided exterior of the housing and operably connect to the mechanically tuneable element. Mechanical means connect between the mechanically tuneable element and the exteriorly located position adjustment means, and an electrical bias source is provided for each of the tuneable elements.

In a typical working embodiment of apparatus according to the invention, the mechanical connecting means between the mechanically tuneable element and the exteriorly located position adjustment means is a coaxial cable, the conductors of which carry the electrical biases to the tuneable elements.

In a preferred embodiment according to the invention, the mechanically tuneable element is a Gunn diode, the electronically biased and adjustable tuneable element is a varactor, the varactor is fixedly attached to the center post of the coaxial cable component and is in pressure contact with the top surface of the Gunn diode element. The exterior conductor of the coaxial cable element carries bias to the Gunn diode and the varactor is biased directly through electrical contact with the center conductor of the coaxial cable element.

BRIEF DESCRIPTION OF THE DRAWING

The invention will now be described in greater detail and with reference to the drawing appended hereto wherein.

DETAILED DESCRIPTION

Figure 1:
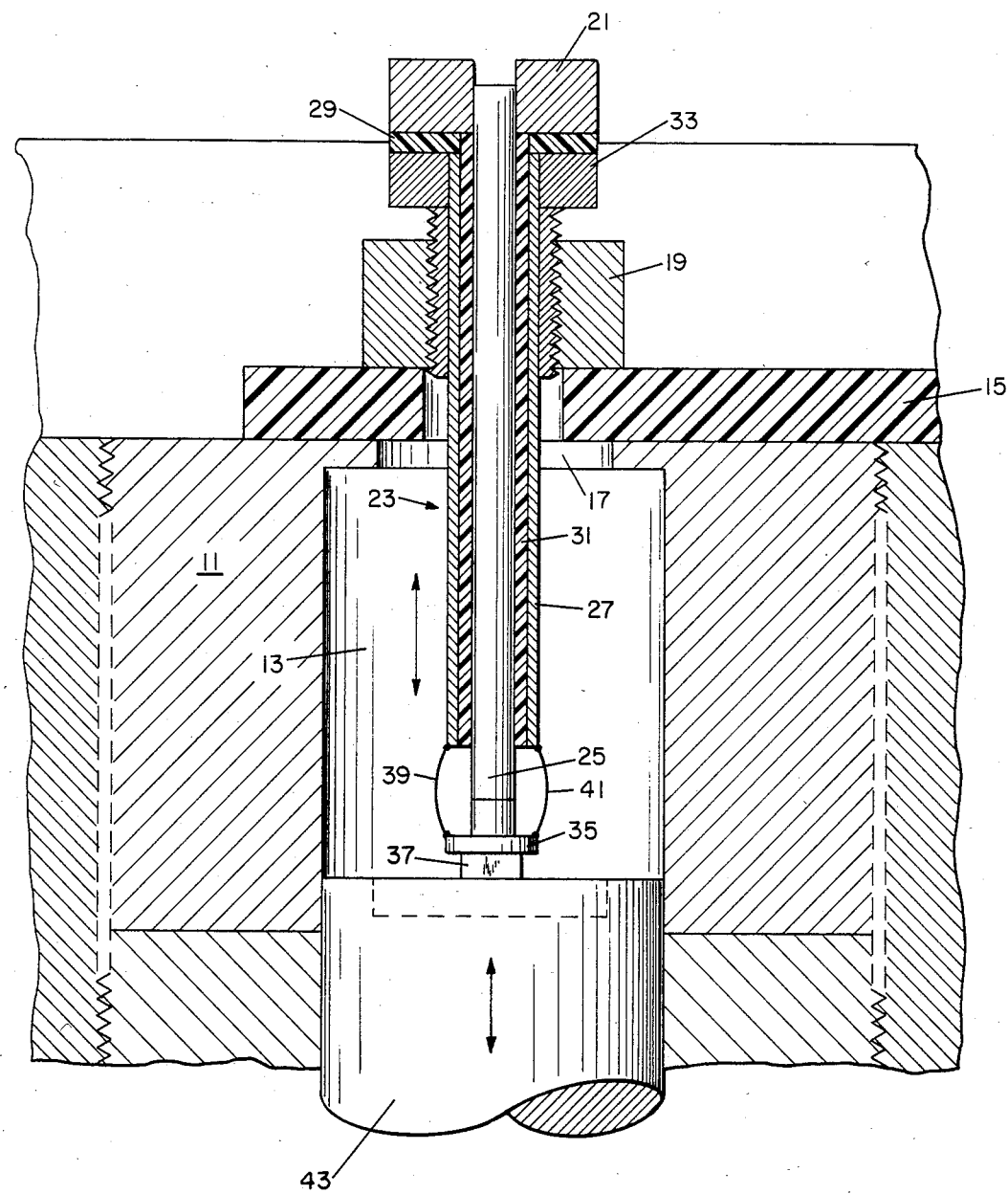
FIG. 1 is an elevational sectional view through an embodiment of apparatus according to the invention showing a portion of the housing and the assembly of the apparatus constituting the invention enclosed therein.

With reference to drawing FIG. 1, a housing, indicated generally at 11, is shown threadedly engaged in a suitable mount such as for instance an equipment base or chassis. Housing 11, as illustrated in FIG. 1, consists of two concentrically aligned exteriorly threaded sections to facilatate fabrication and assembly. A resonating cavity 13 is formed concentrically interiorly of housing 11. An oscillator power output plate 15 of alumina or the like material is affixed to the chassis and has a port or bore 17 concentrically aligned with cavity 13.

An interiorly threaded fixed brass collar 19 of a Gunn diode mounts fixedly atop the output plate 15 with its threaded bore concentrically aligned with the center line of the bore 17 and cavity 13.

Figure 2:
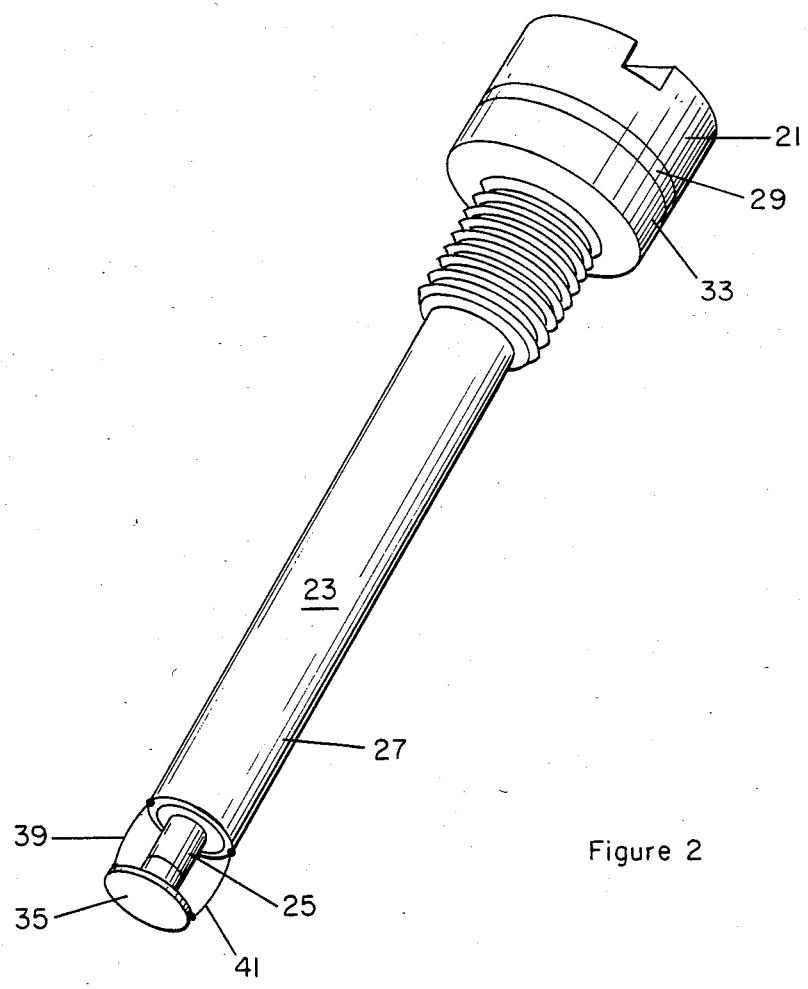
FIG. 2 is an isometric view of the dual bias post arrangement of elements constituting the combination of apparatus elements externally adjustable through the exterior adjustment means.
Figure 3:
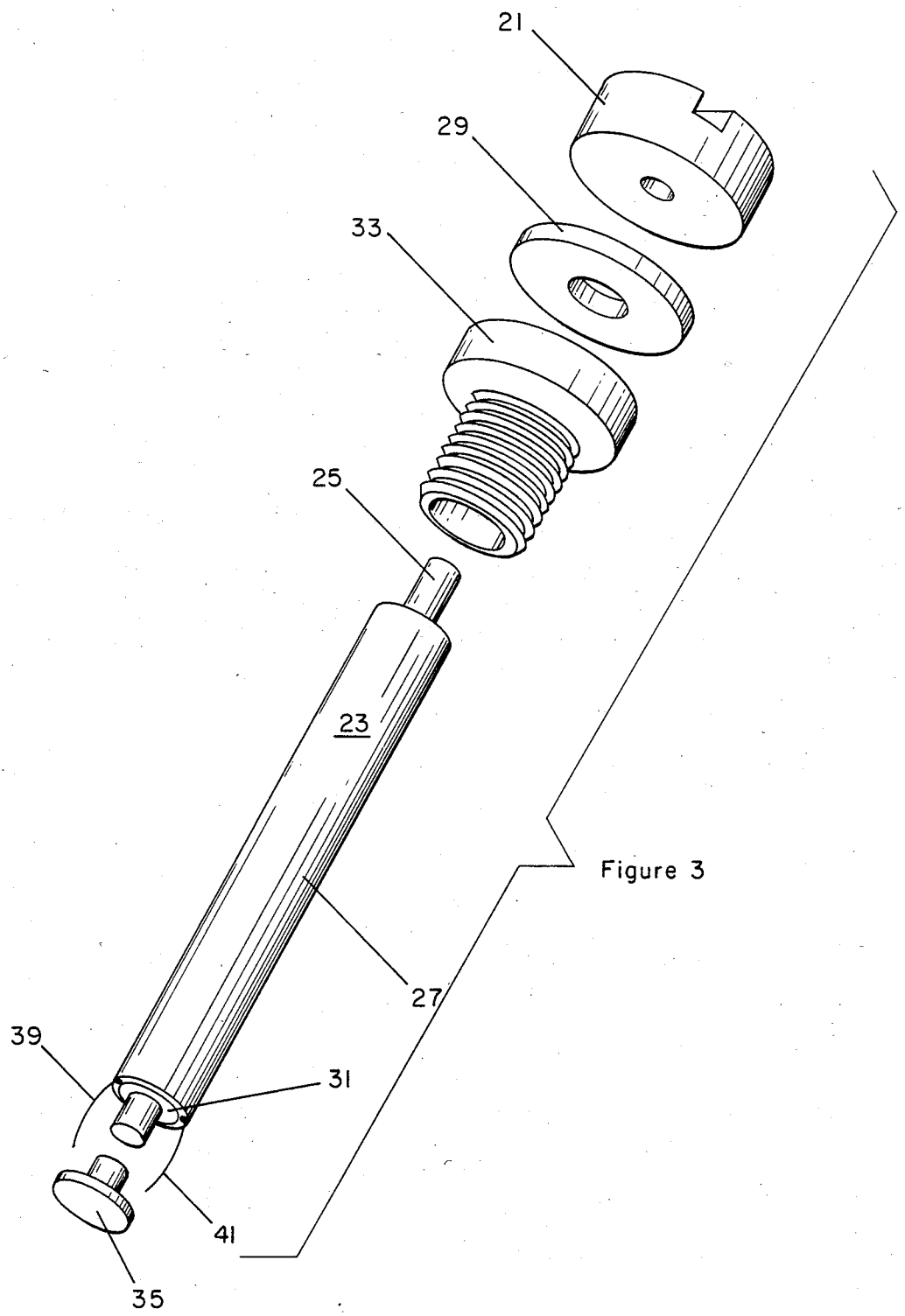
FIG. 3 is an unassembled or exploded view of the apparatus illustrated in FIG. 2.

The adjustably moveable assembly of the apparatus, shown in place in the apparatus in FIG. 1 and in more specific detail in FIGS. 2 and 3 of the drawing, comprises a slotted cylindrical adjusting head 21 having a concentric bore to accomodate the central conductor 25 of a coaxial cable 23 length, which is also part of the assembly, an alumina or the like insulator sleeve 29 in concentric alignment with head 21 and provided with a cylindrically axial bore to accomodate the insulation sleeve 31 and concentric inner conductor 25 of coaxial cable 23, and a Gunn diode bias adjusting mount 33. Adjusting mount 33 has an exteriorly threaded shank section which threadedly engages and moves in the Gunn diode threaded collar 19, and cylindrical shoulder section atop the threaded shank to provide stop limit for the diode tuning adjustment. The adjustably moveable assembly of the apparatus is completed with a varactor diode disc 35 fixedly attached to the lower end of coaxial cable central conductor 25, the Gunn diode 37 mounted on moveable piston 43 with the diode flange and in pressure-contact with the metal underside of varactor diode 35, and bias wires 39, 41 connecting the Gunn diode to the coaxial cable outer conductor 27. The varactor diode 35 receives its bias voltage directly through central conductor 25 of coaxial cable 23 by means of external circuitry not shown in the drawing.

In operation, the Gunn diode is tuned first to the frequency desired by means of turning the threaded moveable assembly inwardly and/or outwardly in the resonating cavity 13 by means of a screw driver applied to the slot in adjusting head 21. When the desired position of the Gunn diode moveable piston in the cavity 13 is achieved so that resonance at the desired frequency is effected, and the wave power output is available into the aluminia power output plate 15, the electrical bias on the varactor 35 is varied until the precise frequency at the fine-tuning point is attained.

The entire apparatus is facilely disassembled and stripped for parts replacement and inspection. The individual components of the apparatus are readily accessible for inspection and/or replacement in like manner. With the combination of the rugged and steady state ability of the Gunn diode enhanced by the attainment of fine-tuned frequencies with the coupled varactor diode element, this apparatus achieves heretofore unattainable, or at best difficultey attainable, fine-tuning results for circuits in which it is applied.

BEST MODE

In a preferred or best mode of practicing our invention, we have, in accordance with the foregoing description, provided a Gunn diode having an over all diameter in the order of 0.09 inch, center bored to accomodate a coaxial cable of 0.045 inch, and having a threaded shank of 0.07 inch diameter and 0.120 inch in length. The shoulder portion of the bias adjusting mount is 0.04 inch in length and 0.09 inch diameter. The insulator sleeve 29 used is 0.02 inch in thickness, 0.09 inch in diameter and center bored to a diameter of 0.03 inch to accomodate the outside diameter of the insulator sleeve 29 of the coaxial cable used. The adjusting head 21 is 0.09 inches in diameter, 0.04 inch in length or depth and center bored to a diameter of 0.03 inch to accommodate the inner conductor 25 of coaxial cable 23. The Gunn diode fixed collar 19 is 0.120 inch in diameter, 0.07 inch in length or depth, and drilled and tapped to a thread depth diameter of 0.07 inch. The machined metal portions of the assembly, that is to say the fixed collar 19, the bias adjusting mount 33, and the adjusting head 21, are all of brass. The insulating portions, such as insulator sleeve 29 and the power output plate 15, are of alumina. The apparatus housing 11 is of brass, and is formed in two sections, the sections being of 0.375 inch outside diameter and provided with a thread for mounting in a chassis or other type frame. The cavity is bored to a diameter of 0.156 inch, and the vertical movement range of the piston 43 by means of the moveable adjustment of the Gunn diode element assembly is 0.70 inch.

A bias voltage of +4 volts was applied to the Gunn diode and a bias voltage of 0 to +4 volts to the varactor diode. The assembly was first tuned to an output frequency of 59.9 GHz and then by varying the voltage on the varactor diode from 0 volts to +4 volts, a frequency change to 60.8 GHz resulted.

The foregoing description of the apparatus according to our invention is intended to be illustrative only and should not be contrued in any limiting sense, it being out intention to define the limits of the invention by the appended claims.

What is claimed is:

1. An oscillator comprising, in combination; a housing having a resonating cavity;
    a solid state mechanically tuneable element adjustably disposed in said housing extending concentrically through said resonating cavity, and capable of producing a wave form energy output of a frequency relative to its position in said resonating cavity;
    a solid state electronically tuneable element in circuit with and arranged and disposed concentrically with the mechanically tunable element;
    position adjustment means exterior of said housing operably connected to said mechanically tuneable element;
    mechanical connecting means between the mechanically tunable element and said position adjustment means; and
    electrical bias sources operably connected respectively to each of the said tuneable elements.

2. An oscillator according to claim 1 wherein said mechanical connecting means between the mechanically tuneable element and said position adjustment means is a coaxial cable component, the conductors of which respectively carry the electrical biases to the said tuneable elements.

3. An oscillator according to claim 1 wherein the solid state mechanically tuneable element is threadedly engaged in the housing and is adjustable therein to vary the volume of said resonating cavity.

4. An oscillator to claim 1 wherein said solid state mechanically tuneable element is a Gunn diode.

5. An oscillator according to claim 1 wherein said solid state electronically tuneable element is a varactor diode.

6. An oscillator according to claim 1 wherein said solid state mechanically tuneable element is a Gunn diode, and said solid state electronically tuneable element is a varactor which is concentrically disposed and in pressure contact with said Gunn diode.

7. An oscillator according to claim 1 wherein said solid state mechanically tuneable element is a Gunn diode, said solid state electronically tuneable element is a varactor, said mechanical connecting means between the mechanically tuneable element and the position adjustment means is a coaxial cable component;
    the varactor being fixedly attached to the center conductor of the coaxial cable component, and in pressure contact with an electrode of the Gunn diode, the varactor element receiving its bias voltage through the center conductor of the coaxial cable component and the Gunn diode receiving its bias voltage through the outer sleeve conductor of the coaxial cable component.

* * * * *